US008747942B2

(12) United States Patent
Nalamasu et al.

(10) Patent No.: US 8,747,942 B2
(45) Date of Patent: Jun. 10, 2014

(54) CARBON NANOTUBE-BASED SOLAR CELLS

(75) Inventors: Omkaram Nalamasu, San Jose, CA (US); Charles Gay, Westlake Village, CA (US); Victor L. Pushparaj, Sunnyvale, CA (US); Kaushal K. Singh, Santa Clara, CA (US); Robert J. Visser, Menlo Park, CA (US); Majeed A. Foad, Sunnyvale, CA (US); Ralf Hofmann, Soquel, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1019 days.

(21) Appl. No.: 12/797,529

(22) Filed: Jun. 9, 2010

(65) Prior Publication Data

US 2010/0313951 A1    Dec. 16, 2010

Related U.S. Application Data

(60) Provisional application No. 61/185,928, filed on Jun. 10, 2009, provisional application No. 61/303,617, filed on Feb. 11, 2010.

(51) Int. Cl.
    *B05D 5/12* (2006.01)
(52) U.S. Cl.
    USPC .............................. 427/74; 136/256
(58) Field of Classification Search
    USPC ............................................. 427/74
    See application file for complete search history.

(56) References Cited

U.S. PATENT DOCUMENTS 6,504,292 B1 * 1/2003 Choi et al. .................... 313/310
7,330,369 B2   2/2008 Tran ............................. 365/151

(Continued)

FOREIGN PATENT DOCUMENTS

KR  10-2005-0087247 A   8/2005
KR  10-2007-0056581 A   6/2007
KR  10-2007-0078530 A   8/2007

OTHER PUBLICATIONS

Wei et al. (Electrical transport in pure and boron-doped carbon nanotubes) 1999.*

(Continued)

*Primary Examiner* — Michael Cleveland
*Assistant Examiner* — Austin Murata
(74) *Attorney, Agent, or Firm* — Pillsbury Winthrop Shaw Pittman LLP

(57) ABSTRACT

Solar cells are provided with carbon nanotubes (CNTs) which are used: to define a micron/sub-micron geometry of the solar cells; and/or as charge transporters for efficiently removing charge carriers from the absorber layer to reduce the rate of electron-hole recombination in the absorber layer. A solar cell may comprise: a substrate; a multiplicity of areas of metal catalyst on the surface of the substrate; a multiplicity of carbon nanotube bundles formed on the multiplicity of areas of metal catalyst, each bundle including carbon nanotubes aligned roughly perpendicular to the surface of the substrate; and a photoactive solar cell layer formed over the carbon nanotube bundles and exposed surfaces of the substrate, wherein the photoactive solar cell layer is continuous over the carbon nanotube bundles and the exposed surfaces of the substrate. The photoactive solar cell layer may be comprised of amorphous silicon p/i/n thin films; although, concepts of the present invention are also applicable to solar cells with absorber layers of microcrystalline silicon, SiGe, carbon doped microcrystalline silicon, CIS, CIGS, CISSe and various p-type II-VI binary compounds and ternary and quaternary compounds.

13 Claims, 9 Drawing Sheets

(56) References Cited

U.S. PATENT DOCUMENTS

| | | | |
|---|---|---|---|
| 2001/0031541 A1* | 10/2001 | Madan et al. | 438/482 |
| 2004/0182600 A1* | 9/2004 | Kawabata et al. | 174/250 |
| 2004/0247808 A1* | 12/2004 | Cooper et al. | 428/36.1 |
| 2007/0184647 A1* | 8/2007 | Furukawa et al. | 438/622 |
| 2008/0023067 A1 | 1/2008 | Hu et al. | 136/256 |
| 2008/0066802 A1 | 3/2008 | Reddy | 135/258 |
| 2008/0072961 A1* | 3/2008 | Liang et al. | 136/263 |
| 2008/0166833 A1* | 7/2008 | Deng | 438/96 |
| 2008/0178924 A1 | 7/2008 | Kempa et al. | |
| 2008/0251122 A1 | 10/2008 | Ready | 136/256 |
| 2008/0276987 A1* | 11/2008 | Flood | 136/256 |
| 2009/0183770 A1* | 7/2009 | Nguyen | 136/256 |
| 2010/0075137 A1* | 3/2010 | Sinton et al. | 428/328 |
| 2010/0078066 A1* | 4/2010 | Darling et al. | 136/256 |
| 2011/0023955 A1* | 2/2011 | Fonash et al. | 136/256 |

OTHER PUBLICATIONS

Zhou, Hang, et al.; "Arrays of Parallel Connected Coaxial Multiwall-Carbon-Nanotube-Amorphous-Silicon Solar Cells," Advanced Materials, vol. 21, Issue 38-39, pp. 3919-3923; published online Aug. 17, 2009.

Naughton, Michael, J.; "High Efficiency Solar Power via Separated Photo and Voltaic Pathways," published Feb. 17, 2009, accessed online at the Department of Energy Information Bridge: DOE Scientific and Technical Information; DOE Identifier DOE/FTR/GO18013-1; http://www.osti.gov/bridge.

Camacho, R.E., et al.; Carbon Nanotube Arrays for Photovoltaic Applications; JOM, Mar. 2007, vol. 59, No. 3; pp. 39-42.

* cited by examiner

SECTION X-X

SECTION Y-Y

CARBON NANOTUBE-BASED SOLAR CELLS

CROSS-REFERENCE TO RELATED APPLICATIONS

This application claims the benefit of U.S. Provisional Application Ser. No. 61/185,928 filed Jun. 10, 2009 and U.S. Provisional Application Ser. No. 61/303,617 filed Feb. 11, 2010.

FIELD OF THE INVENTION

The present invention relates generally to solar cells, and more particularly to solar cells comprising carbon nanotubes.

BACKGROUND OF THE INVENTION

Solar cells comprise an absorber layer where photons are absorbed and generate electron-hole pairs. The absorber layer of planar thin film solar cells needs to be thick enough for most of the incident photons to be captured but not so thick that all the charge carriers produced by photon absorption have either recombined or have been trapped before they reach the solar cell electrodes and generate photocurrent. The result is a difficult compromise between these two opposing effects and the efficiency of such cells is less than optimal.

Absorber layers may be comprised of materials such as silicon (microcrystalline and amorphous silicon), other silicon-based materials such as SiGe and carbon doped microcrystalline silicon, copper indium selenide (CIS), copper indium gallium selenide (CIGS), Cu(In,Ga)(S,Se)$_2$ (CISSe), and various II-VI binary and ternary compounds. However, absorber layers are often defective materials with densities of recombination sites that have a significant effect on the efficiency of the solar device. There is a need to reduce the recombination of electron-hole pairs, also referred to herein as decay of charge carriers, in order to provide more efficient solar cells.

Furthermore, for amorphous silicon solar cells there is an additional problem called the Staebler-Wronski effect, which is a degradation of performance over time, and the degradation is greater for thicker amorphous silicon films. For example, a 300 nm amorphous silicon film may exhibit 10-12% light induced degradation in cell efficiency, moreover, the degradation increases exponentially to approximately 30% with increasing film thickness. However, light induced degradation of an amorphous silicon based solar cell depends not only on thickness, but also on the growth rate of the amorphous silicon, the deposition parameters, etc. Microcrystalline silicon films exhibit much less (1-2%) light induced degradation, even when the crystallinity fraction is low.

Improvements in solar cells have been made by creating three dimensional solar cell structures in which the absorber layer is formed over a non-planar surface, such as a surface with raised micron-scale pillars or ridges. This configuration allows for greater light absorption for a given absorber layer thickness, compared with a planar configuration. While promising results have been obtained for such solar cell structures, the fabrication of these cells is difficult on an industrial scale. There is a need for more manufacturable high efficiency solar cells and methods and apparatuses for forming the same.

SUMMARY OF THE INVENTION

In general, embodiments of this invention provide solar cells with carbon nanotubes (CNTs) which are used: to define a micron/sub-micron geometry of the solar cells; and/or as charge transporters for efficiently removing charge carriers from the absorber layer to reduce the rate of electron-hole recombination in the absorber layer. The density of the CNTs may be controlled and the CNTs may be patterned—into bundles, for example.

The approach of the present invention may include, but is not limited to, incorporation of CNTs into absorber materials for efficient removal of holes, where the absorber material may be a material such as silicon (microcrystalline and amorphous silicon), other silicon-based materials such as SiGe and carbon doped microcrystalline silicon, copper indium selenide (CIS), copper indium gallium selenide (CIGS), Cu(In,Ga)(S,Se)$_2$ (CISSe), and various II-VI binary and ternary compounds. Furthermore, the density and alignment of the CNTs can be controlled to optimize solar cell efficiency, including improving light trapping in the absorber layer. Concepts of the present invention are not limited to the use of CNTs, but are applicable to solar cell absorber layers generally with charge conducting nanostructures such as nanorods and nanowires, aligned and non-aligned. Furthermore, concepts of the present invention are applicable to solar cells generally, including multiple junction solar cells.

According to aspects of the invention, a solar cell comprises: an electrically conductive layer; metal catalyst particles attached to the electrically conductive layer; carbon nanotubes formed on the metal catalyst particles; and a photoactive absorber layer formed on the electrically conductive layer, the photoactive absorber layer encapsulating the carbon nanotubes; wherein the carbon nanotubes provide conductive pathways for flow out of the absorber layer of charge carriers generated in the absorber layer. The carbon nanotubes may be vertically aligned, perpendicular to the electrically conductive layer. The density of carbon nanotubes may be in the range of $10^{11}$ to $10^{16}$ per square meter—generally carbon nanotube coverage is only 2-13% in any given area. The carbon nanotubes may penetrate the absorber layer to roughly 5 to 95 percent of the thickness of the absorber layer, and in some embodiments penetration of the absorber layer is to 50 to 80 percent of the thickness of the absorber layer. The carbon nanotubes may be single-walled, double-walled or multi-walled nanotubes. The charge carriers may be holes.

According to further aspects of the invention, a method of forming a solar cell comprises: providing an electrically conductive layer; forming metal catalyst nanoparticles on the surface of the electrically conductive layer; growing carbon nanotubes on the metal catalyst nanoparticles; and depositing a photoactive absorber material over the carbon nanotubes, wherein the photoactive absorber material forms an absorber layer encapsulating the carbon nanotubes. The carbon nanotubes may be deposited by a low temperature (300-550° C.) growth process such as plasma-enhanced chemical vapor deposition (PECVD), low pressure CVD or hot wire CVD (HWCVD) techniques. The metal catalyst nanoparticles may be deposited by low pressure CVD, atomic layer deposition (ALD) or plasma and UV induced ALD techniques.

The approach of the present invention may include defining a micron/sub-micron geometry of a solar cell using carbon nanotube bundles formed on the surface of a substrate, where the bundles may have micron-scale heights and average spacing. A photoactive solar cell layer is deposited over the bundles, such that the layer is continuous, and in some embodiments conformal to the bundles. The photoactive solar cell layer may be comprised of amorphous silicon p/i/n thin films; although, concepts of the present invention are also applicable to solar cells with absorber layers of microcrystalline silicon, SiGe, carbon doped microcrystalline silicon, copper indium selenide (CIS), copper indium gallium selenide (CIGS), Cu(In,Ga)(S,Se)$_2$ (CISSe) and various p-type II-VI binary compounds, such as CdTe, and ternary and quaternary compounds, such as Cu$_2$ZnSnS$_4$.

According to aspects of the invention, a solar cell comprises: a substrate; a multiplicity of areas of metal catalyst on the surface of the substrate; a multiplicity of carbon nanotube bundles formed on the multiplicity of areas of metal catalyst, each bundle including carbon nanotubes aligned roughly perpendicular to the surface of the substrate; and a photoactive solar cell layer formed over the carbon nanotube bundles and exposed surfaces of the substrate, wherein the solar cell layer is continuous over the carbon nanotube bundles and the exposed surfaces of the substrate. The substrate may include an electrically conductive layer at the surface of the substrate; alternatively, there may be an electrically conductive layer on the surface of the substrate, electrically connecting together the carbon nanotube bundles. Furthermore, the thin film solar cell layers may conform to the surfaces of the carbon nanotube bundles. Furthermore, the carbon nanotube bundles may be structurally reinforced—for example, reinforced with electrochemically deposited metal or catalytically deposited material from a gas precursor.

According to further aspects of the invention, a method of forming a solar cell comprises: providing a substrate; forming a distribution of metal catalyst nanoparticles on the substrate; growing carbon nanotube bundles on the metal catalyst nanoparticles; and depositing a continuous solar cell layer over the carbon nanotube bundles. The solar cell layer may conform to the carbon nanotube bundles. The forming a distribution of metal catalyst nanoparticles may include, among other processes: depositing spheres on the substrate; depositing metal catalyst on the spheres; and removing the spheres. Furthermore, the forming a distribution of metal catalyst nanoparticles may include: depositing a thin film of metal catalyst; annealing the thin film to form metal catalyst nanoparticles; and optionally etching the nanoparticles to increase the average spacing between the nanoparticles.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Figure 1:
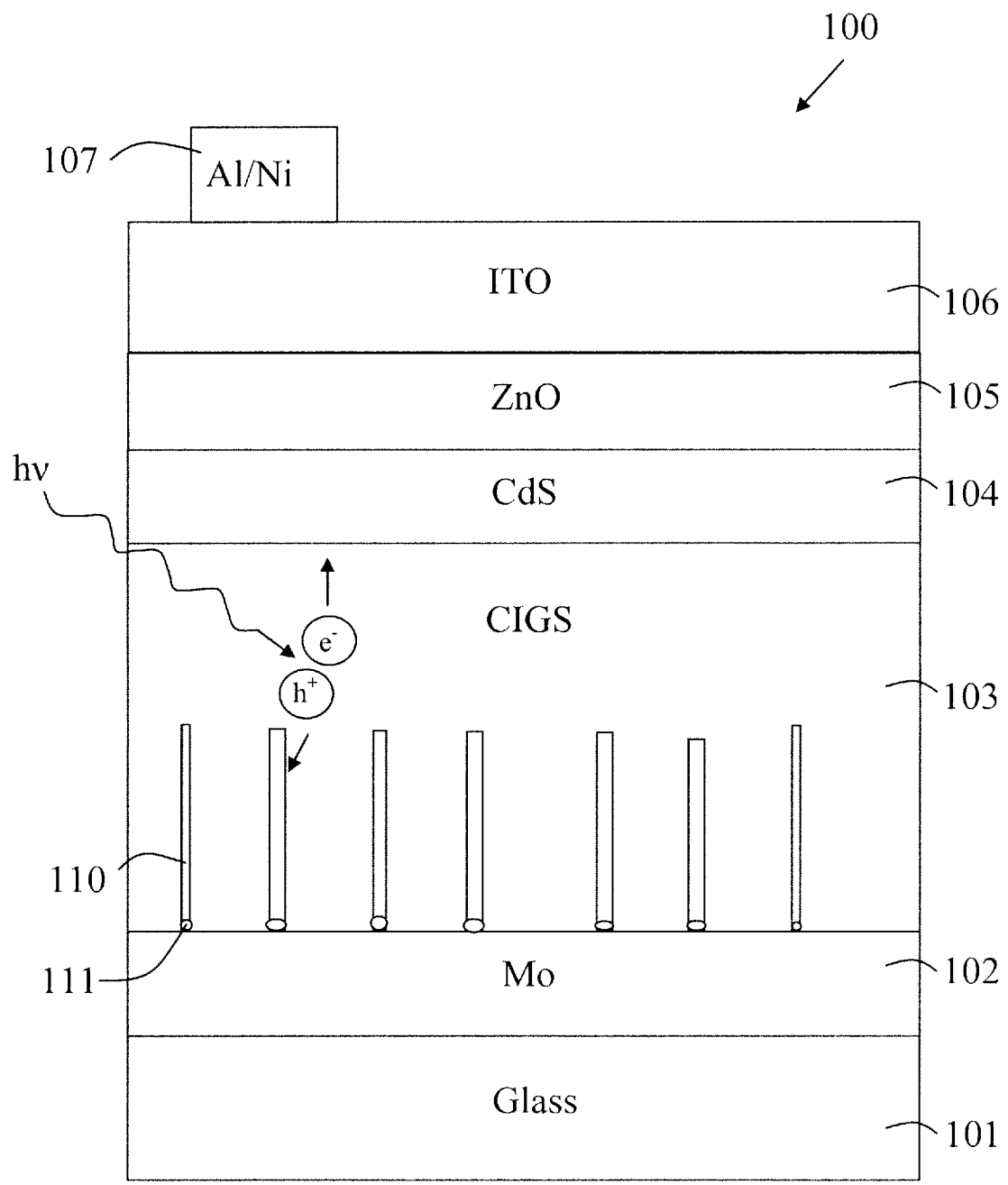
FIG. 1 is a representation of a solar cell with CNT charge transporters, according to some embodiments of the present invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In a solar cell, photons may be absorbed in a photoactive absorber layer and produce electron-hole pairs. In the traditional CIGS solar cell, the resistive path for charge separation and transport through the photoactive absorber layer allows some decay of charges—via recombination—before they are separated and transported away. Recombination reduces the solar cell efficiencies from the theoretical maximum. In embodiments of the present invention, CNTs and other hole transporting nanorods, nanowires, nanotubes, etc. may be configured as effective pathways for conducting away holes and thus reducing the recombination that can occur in the photoactive absorber layer. See FIG. 1.

Solar cells are described generally herein, and specific examples of solar cells are provided. However, concepts of the present invention are not limited to amorphous silicon or copper indium gallium selenide (CIGS) solar cells, but are applicable to solar cells generally, including solar cells with absorber layers of microcrystalline silicon, other silicon-based materials such as SiGe and carbon doped microcrystalline silicon, copper indium selenide (CIS), copper indium gallium selenide (CIGS), Cu(In,Ga)(S,Se)$_2$ (CISSe) and various II-VI binary, ternary and quaternary compounds, such as CdTe. Furthermore, concepts of the present invention are not limited to solar cells with aligned CNTs, but are applicable to solar cells generally, including solar cell absorber layers with charge conducting nanostructures such as CNTs, nanorods and nanowires, aligned and non-aligned.

Carbon nanotubes (CNTs) have electrical and mechanical properties that make them attractive for integration into a wide range of electronic devices, including solar devices. Carbon nanotubes are nanometer-scale cylinders with walls formed of graphene—single atom thick sheets of graphite. Nanotubes may be either single-walled (cylinder wall composed of a single sheet of graphene, referred to as SWNTs) or multi-walled (cylinder wall composed of multiple sheets of graphene, referred to as MWNTs). Nanotubes may have diameters as small as one nanometer, for a SWNT, and length to diameter ratios of the order of $10^2$-$10^5$. Carbon nanotubes may have either metallic or semiconducting electrical properties which make them suitable for integration into a variety of devices, such as solar cells. CNTs are deposited selectively on certain metals at elevated temperatures from hydrocarbon precursor gases. Suitable metals may include iron, nickel, cobalt, copper, molybdenum and their alloys with or without underlayers such as Al, Al$_2$O$_3$, Mo, Ta, and W—the listed metals catalyze the reaction which grows the CNTs. Note that underlayers and substrates such as Si, quartz, SiO$_2$, Ti, SiC, etc. influence the growth process and have a significant effect on the type and properties of the CNTs.

FIG. 1 is a representation of a solar cell 100, according to some embodiments of the present invention. The solar cell 100 comprises a substrate 101. The substrate 101 may be a glass substrate, a metallic flexible substrate or similar. An electrically conductive layer 102, typically 600 nanometers thick, covers the substrate 101. Layer 102 may be a layer of Mo, Fe, TiN, or Cu, all with work functions of roughly 4.6 eV. Layer 102 may also comprise a thin layer of Al, typically 5 nanometers thick, on the top surface. Aligned carbon nanotubes 110 are electrically connected to layer 102. Fe catalyst nanoparticles 111 (varying from 0.5 nm to 10 nm in size) are at the base of the CNTs 110 on top of layer 102. Other catalyst particles such as Co, Ni, Mo, Cu and their alloys, with and without underlayers such as Al, Al$_2$O$_3$, Mo, Ta, and W, may also be used. The CNTs may be SWNTs or MWNTs. The CNTs may be vertically aligned with regular spacing between the individual nanotubes, as represented in FIG. 1. Vertical alignment of the nanotubes may assist in trapping light within the absorber layer 103. As grown, CNTs are an effective medium to transport holes generated in the absorber layer to the lower layer 102. The length of CNTs may be 100 nm to 2.0 um long with a diameter ranging from 0.5 to 15 nm. An absorber layer 103 surrounds the CNTs. The absorber layer and CNTs may typically be configured so that the CNTs extend into the absorber layer between 5 and 95 percent of the thickness of the absorber layer, and in some embodiments penetration to 50 to 80 percent of the thickness of the absorber layer may be preferred. The absorber layer may be CIS, CIGS, etc. A typical thickness for a CIGS layer varies from 1.0 to 2.0 microns. Buffer layers 104 and 105, and a transparent conductive oxide (TCO) layer 106 are on top of the absorber layer, as shown in FIG. 1. The buffer layers may be CdS and ZnO and the TCO layer may be indium tin oxide (ITO), for example. The buffer and TCO layers must be at least partially optically transparent to allow sufficient light to reach the photoactive absorber layer 103. A contact pad 107 is formed on the TCO layer 106. The contact pad may be an aluminum or nickel alloy or similar. The solar cell is activated by completing a circuit between layer 102 and contact pad 107.

Alternatively, the solar cell 100 may be configured with an absorber layer 103 formed of p-i-n layers of amorphous silicon, p-i-n layers of microcrystalline silicon, etc. and appropriate electrode materials are used. For example: layer 102 may be a transparent electrode made of a transparent conductive oxide or other transparent conductive material; and layers 104-106 may be replaced with a reflective electrode made of metals such as silver and aluminum, or an alloy.

The CNTs may be aligned vertically and parallel to each other. Such an alignment provides, on average, the shortest pathway for hole extraction from the absorber layer via the CNTs. Approximations to vertical and parallel alignment of the CNTs are still beneficial. The density of CNTs in the absorber layer may be a comprise between efficiency of electron-hole pair production within the absorber layer and efficiency of hole extraction from the absorber layer. A desirable CNT density may be of the order of $10^{11}$ to $10^{16}$ per square meter.

The absorber layer may be a continuous thin film, formed around the CNTs. Continuous thin films are advantageous over an absorber layer comprised of nanoparticles for the following reasons: (1) a continuous film provides a higher light absorption coefficient across the spectrum from ultraviolet (UV) through near infrared (IR); and (2) electrical conductivity of a continuous thin film is higher, particularly if the surfaces of the nanoparticles are covered in surfactants. Furthermore, a higher light absorption coefficient allows for scaling-down of the absorption layer thickness, from say 2 to 0.2 microns, which provides enhanced solar cell characteristics such as cell energy conversion efficiency η, open circuit voltage ($V_{oc}$), fill factor (FF), and normalized short circuit current ($J_{sc}$).

Figure 2:
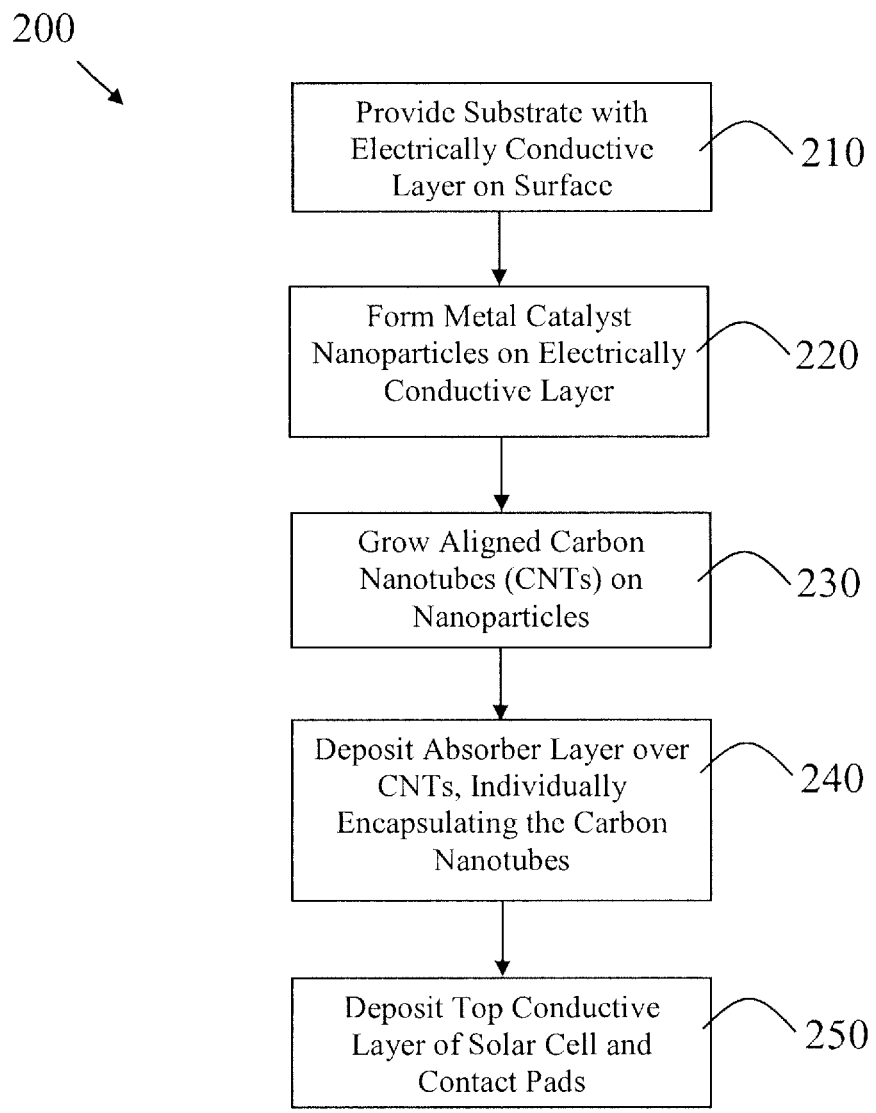
FIG. 2 is a process flow for fabrication of a solar cell with CNT charge transporters, according to some embodiments of the present invention.

A basic method for fabricating a solar cell as in FIG. 1 is shown in the process flow 200 in FIG. 2. The fabrication process includes: providing a substrate with an electrically conductive layer (210); forming metal catalyst nanoparticles on the surface of the electrically conductive layer (220); growing carbon nanotubes on the metal catalyst nanoparticles (230); depositing a photoactive absorber material over the carbon nanotubes, wherein said photoactive absorber material forms an absorber layer encapsulating the carbon nanotubes (240); and depositing top conductive layer of solar cell and contact pads (250). Alternatively, the electrically conductive layer may be deposited after growing the carbon nanotubes.

Figure 11:
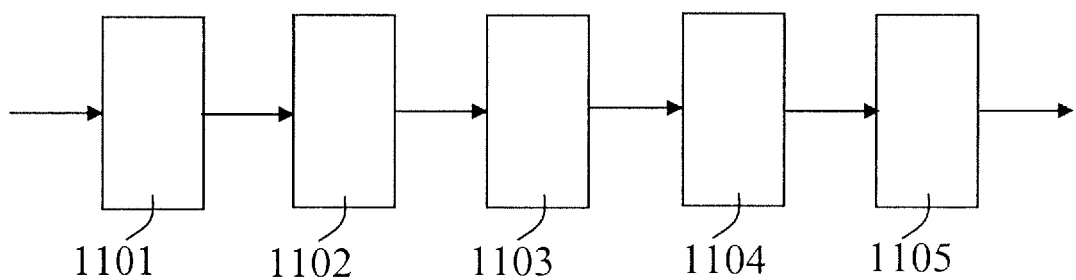
FIG. 11 shows a schematic of an apparatus for fabricating a solar cell such as the solar cell of FIG. 1, according to some embodiments of the invention.

An apparatus for fabricating a solar cell as in FIG. 1, following a method as in FIG. 2, is shown in FIG. 11. The apparatus of FIG. 11 comprises: a system 1101 configured to deposit an electrically conductive layer; a system 1102 configured to form metal catalyst nanoparticles on the surface of the electrically conductive layer; a system 1103 configured to grow carbon nanotubes on the metal catalyst nanoparticles; a system 1104 configured to deposit a photoactive absorber material over the carbon nanotubes, wherein the photoactive absorber material forms an absorber layer encapsulating the carbon nanotubes; and a system 1105 configured to deposit a top conductive layer over the photoactive absorber layer and to deposit contact pads. The systems of the apparatus are shown schematically; the systems may be arranged as a linear apparatus, one or more cluster tools, or other variations. The systems may be PVD, CVD, ALD, PECVD, HWCVD, etc. as described below with reference to FIG. 1.

A specific example of the fabrication process is described in detail, with reference to FIG. 1. The substrate 101 is provided. Conductive layer 102 is deposited on top of the substrate 101 using well-known deposition techniques. A thin layer of Al, typically 5 nanometers thick, is deposited on layer 102 by a PVD sputtering technique, followed by a thin layer of Fe (<2 nm) which is formed on the surface of the continuous Al layer as Fe nanoparticles 111. The diameter of the Fe nanoparticles will determine the CNT diameter. The iron may be deposited by PVD, low pressure thermal CVD, ALD, PECVD, HWCVD, or plasma and UV induced ALD techniques. The metal catalyst nanoparticles may be deposited by low pressure CVD, ALD, or plasma and UV induced ALD techniques.

Aligned carbon nanotubes 110 are then formed on the Fe nanoparticles 111. The CNTs may be grown by standard techniques, including plasma-enhanced chemical vapor deposition (PECVD), hot wire CVD (HWCVD) and thermal CVD. The CNTs may be grown so as to be relatively evenly spaced and vertically aligned (perpendicular to the surface of layer 102). Furthermore, CNT growth may be controlled to achieve a desired density in the range of $10^{11}$ to $10^{16}$ CNTs per square meter. Note that the Fe catalyst nanoparticles 111 will remain at the base of the CNTs. The Al layer may or may not remain as a continuous film after CNT growth. Once the CNTs are grown, the absorber layer 103 may be deposited by well-known techniques, including thermal deposition (including HWCVD), electro-deposition and sol gel techniques. Adding thermal energy during deposition of the absorber layer 103 may improve the contact between the CNTs and the absorber layer material (e.g. CIGS). Once the absorber layer 103 is deposited, then the remaining layers—buffer layers 104 and 105, and a TCO layer 106—are deposited using well-known techniques. Finally, a contact pad 107 is deposited using well-known deposition and patterning techniques.

In some embodiments of the present invention, where the CNTs 110 are not aligned, CNT growth techniques such as arc discharge or laser ablation may also be used.

Although embodiments of the present invention have been described with solar cells configured for hole removal via CNTs, the concepts of the present invention may be applicable to other devices in which hole removal from a device layer via CNTs may be advantageous.

The approach of the present invention may include defining a micron/sub-micron geometry of a solar cell using CNT bundles formed on the surface of a substrate, where the bundles may have micron-scale heights and average spacing. A photoactive solar cell layer is deposited over the bundles, such that the layer is continuous, and in some embodiments conformal to the bundles. The photoactive solar cell layer may be comprised of amorphous silicon p/i/n thin films; although, concepts of the present invention are also applicable to solar cells with absorber layers of SiGe, carbon doped microcrystalline silicon, copper indium selenide (CIS), copper indium gallium selenide (CIGS), Cu(In,Ga)(S, Se)$_2$ (CISSe) and various p-type II-VI binary compounds, such as CdTe, and ternary and quaternary compounds, such as Cu$_2$ZnSnS$_4$.

Figure 3:
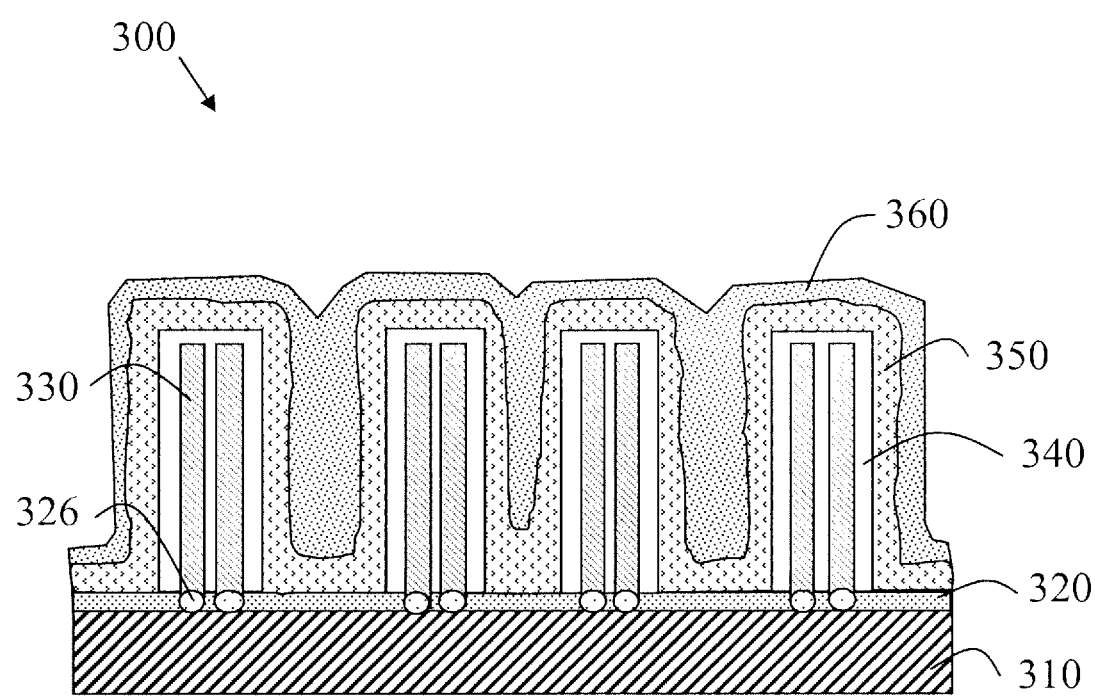
FIG. 3 is a representation of a CNT bundle-based solar cell, according to some embodiments of the present invention.

FIG. 3 is a representation of a CNT bundle-based solar cell 300. The solar cell 300 comprises a substrate 310 with a conductive layer 320. The substrate 310 may be a glass substrate, a metallic flexible substrate or similar. The conductive layer 320 may be a metal or a transparent conductive oxide (TCO)—such as ITO. CNTs 330 are formed on areas of metal catalyst 326. The metal catalyst may be iron, nickel, cobalt or an alloy of some or all of the aforementioned elements. Note that there may be multiple CNTs on each area of metal catalyst—depending on the size of the area of catalyst and the CNT growth conditions. The CNTs 330 are shown to be grouped in four bundles; although, each bundle may comprise CNTs on a single area of metal catalyst or CNTs on many areas of metal catalyst. In the particular embodiment shown in FIG. 3, the conductive layer 320 was deposited after the catalyst particles 326 and growth of CNTs 330, hence the catalyst particles sit directly on the surface of the substrate 310; in other embodiments the conductive layer may be deposited first, followed by the catalyst particles 326, in which case the catalyst particles 326 sit on the conductive layer 320—see FIG. 10 below. In FIG. 3 the CNTs 330 are shown to be in four bundles reinforced by material 340, which can be an electrodeposited metal or a catalytically deposited material from vapor phase, for example. The CNT bundles may be approximately 1 to 3 microns tall, 0.1 to 0.3 microns in diameter, and separated on average by a center-to-center spacing of approximately 1 to 2 microns. Photoactive absorber layer 350 is a continuous layer which covers the CNT bundles. The photoactive absorber layer 350 is covered by a top electrode 360. If the solar cell 300 is to be illuminated through the substrate 310, then the substrate 310 and conductive layer 320 must be transparent—with good light transmission over the wavelength range from 250 nanometers to 1.1 microns. If the solar cell 300 is to be illuminated through the top electrode 360, then the top electrode 360 must be transparent—with good light transmission over the wavelength range from 250 mm to 1.1 μn.

Electrical contact will be made to the upper and lower electrodes (360 & 320) of the solar cell of FIG. 3 using processing techniques known to those skilled in the art. For example, electrical contact may be made to the lower electrode 320 by a process which includes laser cutting through upper layers to expose a region of electrode 320. Photolithographic techniques may also be used.

It is apparent from FIG. 3 that the configuration of the photoactive absorber layer 350 permits most of the incident photons to be captured but the layer 350 is not so thick that all the charge carriers produced by photon absorption have either recombined or have been trapped before they reach the solar cell electrodes and generate photocurrent. This configuration permits a more favorable compromise between light collection efficiency and cell photocurrent generation than for a planar photo absorber layer. Furthermore, the solar cell 300 may be fabricated using an efficient process, suitable for scaling up for manufacturing.

A basic method for fabricating a solar cell as in FIG. 3 includes: providing a substrate; forming a distribution of metal catalyst nanoparticles on the substrate; growing carbon nanotube bundles on the metal catalyst nanoparticles; and depositing a continuous photoactive solar cell layer over the carbon nanotube bundles. A more detailed example of a method for fabricating a solar cell as in FIG. 3 is shown in the process flow 400 in FIG. 4. The fabrication process includes: providing a substrate with an electrically conductive layer at the substrate surface (410); depositing spheres on the substrate surface (420); depositing metal catalyst on sphere covered substrate (430); removing the spheres, leaving metal catalyst islands on the substrate (440); growing carbon nanotube on metal catalyst islands, forming CNT bundles (450); and depositing a continuous photoactive absorber layer over the carbon nanotube bundles and exposed surface of the substrate (460). An alternative process flow 500 is shown in FIG. 5. The fabrication process 500 includes: providing a substrate (510); depositing a metal catalyst thin film on the substrate surface (520); annealing the catalyst thin film to form metal catalyst nanoparticles on the substrate (530); optionally, etching the nanoparticles if needed to increase the spacing of the nanoparticles (540); growing CNTs on metal catalyst nanoparticles, forming CNT bundles (550); forming an electrically conductive layer on the substrate surface to electrically connect to the CNT bundles (560); and depositing a continuous photoactive absorber layer over the CNTs and exposed surface of the electrically conductive layer (570). Process flows 400 and 500 are merely examples of many process flows that can be used to form the solar cells of the present invention. After reading this disclosure those skilled in the art will appreciate that there are many variations of the process flows 400 and 500 which can be used to fabricate solar cells such as those shown in FIGS. 3 and 10. For example, process flow 500 can readily be modified for a substrate with an electrically conductive layer at the surface of the substrate, rather than forming an electrically conductive layer after the CNT deposition. Furthermore, process flow 400 can readily be modified to include annealing and/or etching of the metal catalyst islands in order to increase the spacing of CNT bundles.

Methods for creating a distribution of metal catalyst particles include patterning processes. These patterning processes may be divided into three broad categories: self-organized patterning, patterning using surface modification, and standard optical lithography-based patterning techniques—such as photolithography followed by etch, and photolithography followed by metal deposition and then lift-off The sphere process and the annealing process described above with reference to FIGS. 4 & 5 are examples of a self-organized process; a further example of a self-organized process is to coat or print the substrate/electrode with sterically stabilized nanoparticles. Sterically stabilized nanoparticles are particles which are covered by a layer of long or short chain polymers, where the polymer tail is helping to make the particles soluble and also preventing the nanoparticles from getting too close to each other and coagulating. Patterning using surface modification is modification of a surface such that nanoparticles of metal catalyst will only stick on the modified areas (or only stick on the non-modified areas). Examples of surface modification include: nanoimprint lithography; holography; and ink jet printing. Examples of standard optical lithography process flows include: (1) metal deposition followed by resist deposition, photolithography and then etch; and (2) resist deposition followed by photolithography, metal deposition and then lift-off.

Figure 4:
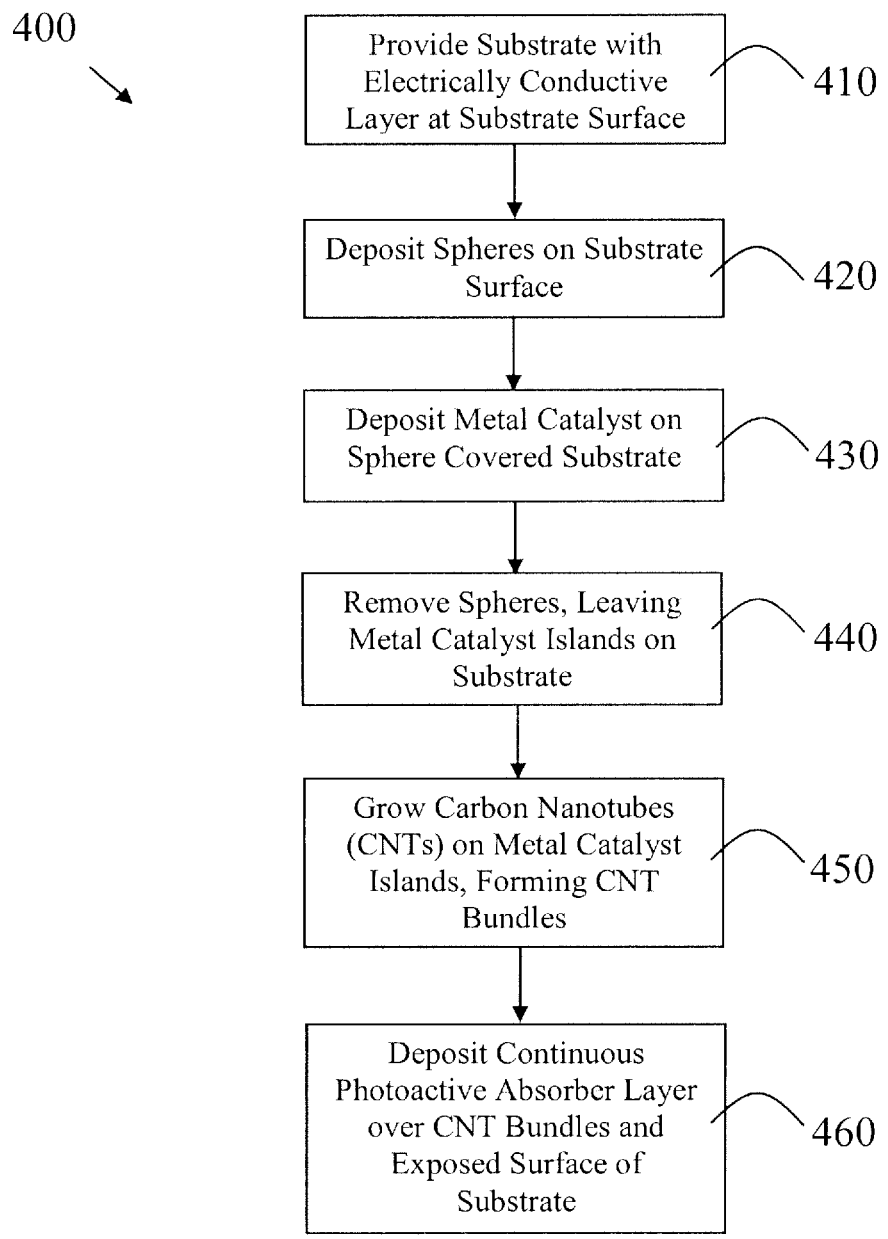
FIG. 4 is a first process flow for fabrication of a CNT bundle-based solar cell, according to some embodiments of the invention.
Figure 5:
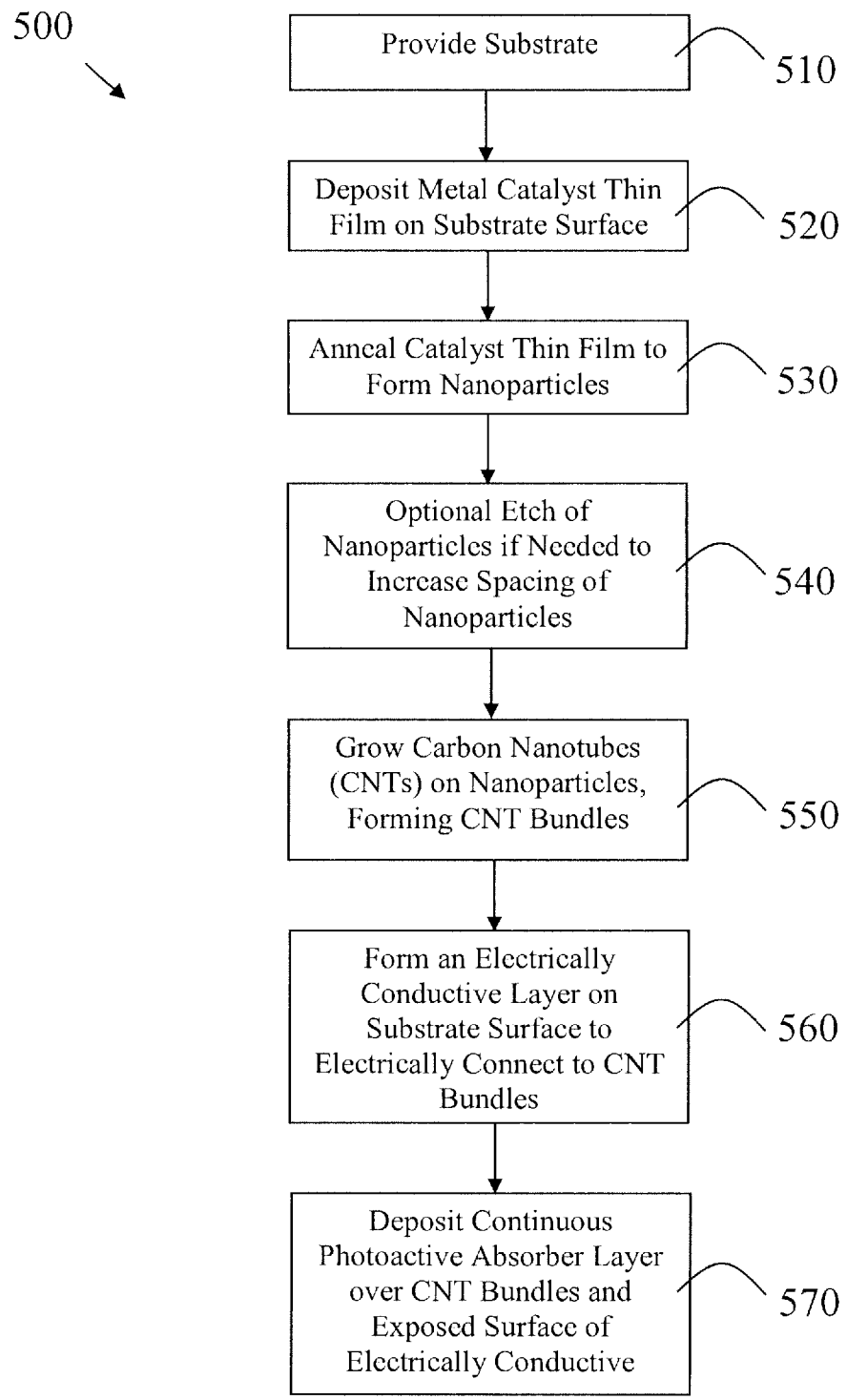
FIG. 5 is a second process flow for fabrication of a CNT bundle-based solar cell, according to some embodiments of the invention.
Figure 6A:
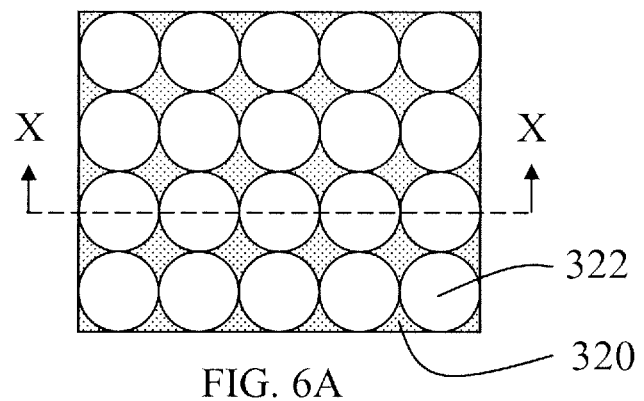
FIGS. 6A & 6B show views of a representation of a substrate coated with spheres, which is part of a process for fabricating a CNT bundle-based solar cell, according to some embodiments of the invention.
Figure 6B:
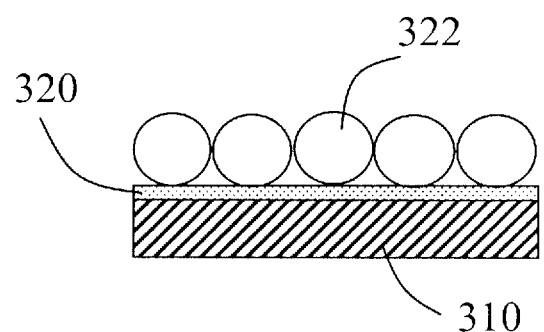
Figure 7:
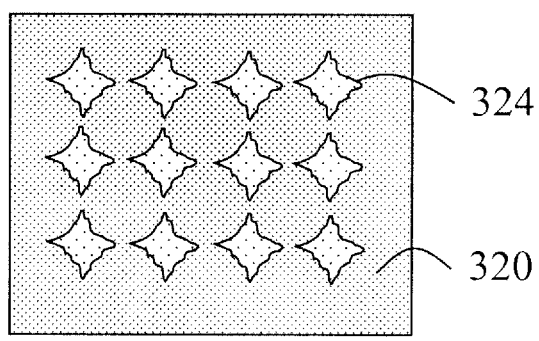
FIG. 7 shows a representation of the substrate of FIG. 6A after deposition of metal catalyst over the spheres and removal of the spheres, which is part of a process for fabricating a CNT bundle-based solar cell, according to some embodiments of the invention.

FIGS. 6A, 6B & 7 illustrate aspects of the process steps 420, 430 and 440 shown in FIG. 4. FIGS. 6A & 6B show substrate 310 covered on the top surface by an electrically conductive layer 320, the latter being covered by spheres 322. The spheres 322 may be comprised of styrene and have micron-scale diameters—for example, diameters chosen from within the range of 5 to 10 microns. A thin layer of catalyst metal is deposited over the spheres 322, coating the spheres 322 and the exposed areas of the electrically conductive layer 320. The spheres are removed using a suitable solvent and/or ultrasonic bath, leaving behind islands 324 of catalyst metal on the surface of the electrically conductive layer 320—as shown in FIG. 7.

Figure 8:
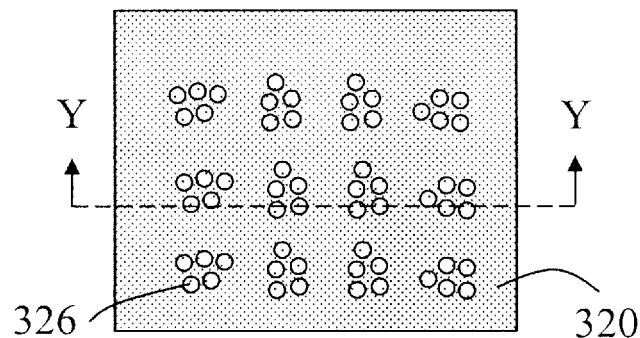
FIG. 8 shows a representation of the substrate of FIG. 7 after annealing to form nanoparticles of the catalyst metal, which is part of a process for fabricating a CNT bundle-based solar cell, according to some embodiments of the invention.

FIG. 8 provides a representation of how the metal islands 324 in FIG. 7 may be transformed by annealing and/or etching. Each of the islands 324 has been transformed into multiple nanoparticles 326. Furthermore, if each island 324 will define a CNT bundle, and each equivalent group of nanoparticles 326 will also define a CNT bundle, then the average spacing of the bundles will be increased.

Figure 9:
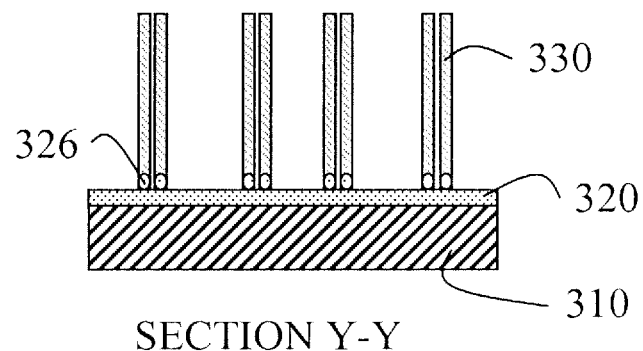
FIG. 9 shows a cross-sectional representation of the substrate of FIG. 8 after growing CNTs, which is part of a process for fabricating a CNT bundle-based solar cell, according to some embodiments of the invention.

FIG. 9 shows a cross-section of the substrate of FIG. 8 on which CNTs have been grown. The CNTs 330 grow only on the catalyst metal nanoparticles 326. The CNT growing conditions are chosen to provide CNTs 330 which are roughly perpendicular to the substrate surface. The CNTs are grown at substrate temperatures varying from 350 to 800° C., and at pressures varying from 10 Torr to 300 Torr. A typical carbon precursor is methane, and other carbon precursors like ethylene and xylene can also be used for the deposition of the CNTs.

Figure 10:
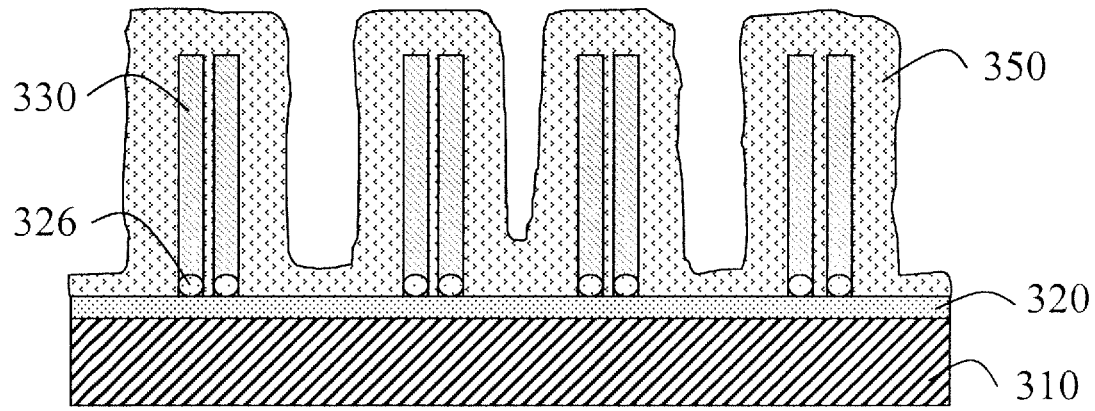
FIG. 10 shows a cross-sectional representation of the substrate of FIG. 9 after deposition of solar cell layers, which is part of a process for fabricating a CNT bundle-based solar cell, according to some embodiments of the invention.

FIG. 10 shows the substrate of FIG. 9 over which a photoactive absorber layer 350 has been deposited. The deposition conditions will be optimized to provide a continuous film over the CNT bundles; in some embodiments the absorber layer 350 will be conformal to the bundles and the exposed areas of the electrically conductive layer 320. The continuous and conformal films of electrically conducting layers, such as Ni, Al, indium tin oxide (ITO), ZnO, and aluminum doped ZnO (AZO) can be deposited by thermal evaporation, sputtering, PECVD or ALD processes. To complete the solar cell, a top electrode will be deposited and electrical contact will be made to both top and bottom electrodes.

Comparison of FIGS. 3 and 10 show some of the variations in the configuration of solar cells of the present invention. For example, FIG. 3 shows an electrically conductive layer 320 which is deposited after CNT growth and FIG. 10 shows an electrically conductive layer deposited on top of the substrate 10 prior to deposition of the metal catalyst. Furthermore, the solar cell of FIG. 3 has reinforcement of the CNT bundles by a reinforcement material 340, whereas the solar cell of FIG. 10 has no CNT bundle reinforcement—the photoactive absorber layer 350 is deposited directly over the CNT bundles.

To improve the electrical properties of the CNTs and to improve the electrical interface between the CNTs and photoactive absorber layers, the CNTs may be doped with boron. Boron doping may be achieved during CNT growth or after growth using ion implantation techniques. Furthermore, to avoid plasma damage of the CNTs, non-plasma deposition techniques, such as HWCVD, may be used for depositing: (1) the photoactive absorber layer which encapsulates the carbon nanotubes; and (2) the continuous photoactive solar cell layer over the carbon nanotube bundles.

Figure 12:
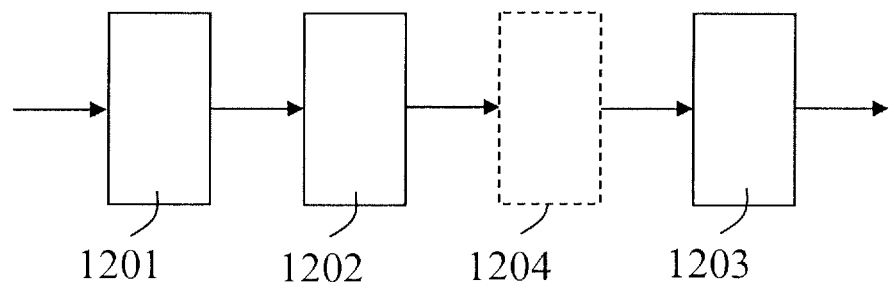
FIG. 12 shows a schematic of an apparatus for fabricating a solar cell such as the solar cells of FIGS. 3 & 10, according to some embodiments of the invention.

An apparatus for fabricating a solar cell as in FIG. 3 or FIG. 10, following a method as in FIG. 4 or 5 or an equivalent method, is shown in FIG. 12. The apparatus of FIG. 12 comprises: a system 1201 configured to form a distribution of metal catalyst nanoparticles on a substrate; a system 1202 configured to grow carbon nanotube bundles on the distribution of metal catalyst nanoparticles; a system 1203 configured to deposit a continuous photoactive solar cell layer over the carbon nanotube bundles. In embodiments in which the substrate does not have an electrically conductive layer at the substrate surface, a system 1204 configured to deposit an electrically conductive layer over the carbon nanotube bundles may be added as shown in FIG. 12. The systems of the apparatus are shown schematically; the systems may be arranged as a linear apparatus, one or more cluster tools, or other variations. The systems may include PVD, CVD, ALD, PECVD, HWCVD, etc., and as indicated above.

Figure 13:
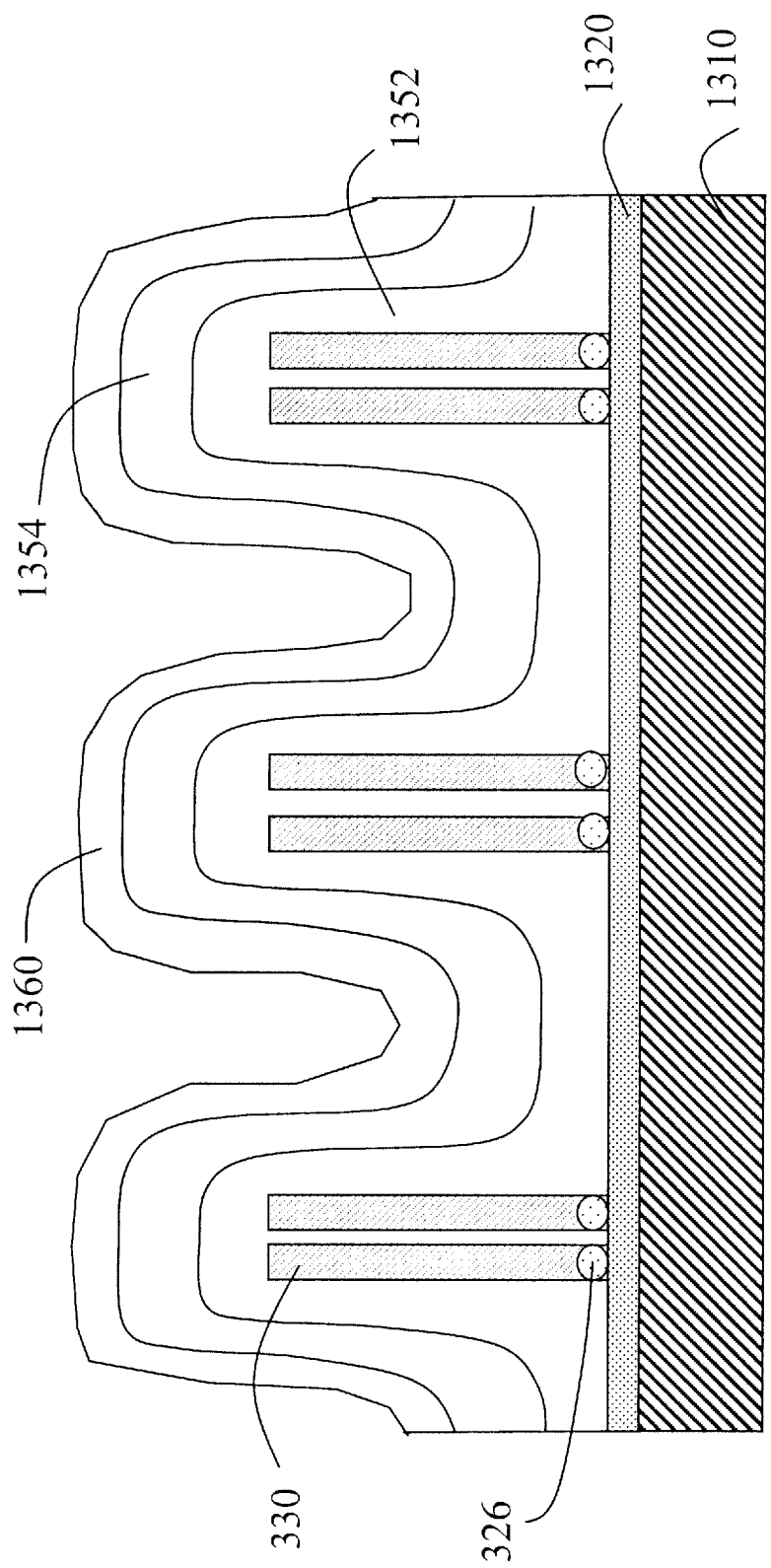
FIG. 13 shows a cross-sectional representation of a CNT bundle-based solar cell with multiple junctions.

Concepts of the present invention are not limited to single junction solar cells, but are applicable to multiple junction solar cells—solar cells comprising two or more junctions. For example, FIG. 13 shows a cross-section through a CNT bundle-based solar cell with multiple junctions. In FIG. 13, the solar cell may comprise a transparent substrate 1310, a transparent conductive layer 1320, metal catalyst areas 326, CNTs 333, a first photoactive solar cell layer 1352, a second photoactive solar cell layer 1354, and an electrode 1360. The first photoactive solar cell layer 1352 may comprise an amorphous silicon p-i-n or n-i-p junction and the second photoactive solar cell layer 1354 may comprise a microcrystalline p-i-n or n-i-p junction. Furthermore, the first and second photoactive solar cells may also be chosen from other silicon based thin film solar cells, such as SiGe and carbon doped microcrystalline silicon.

Although the present invention has been particularly described with reference to certain embodiments thereof, it should be readily apparent to those of ordinary skill in the art that changes and modifications in the form and details may be made without departing from the spirit and scope of the invention. It is intended that the appended claims encompass such changes and modifications. The following claims define the present invention.

What is claimed is:

1. A method of forming a solar cell comprising:
   providing a substrate;
   forming a distribution of metal catalyst nanoparticles on said substrate, wherein said forming said distribution of metal catalyst nanoparticles includes:
   depositing a thin film of metal catalyst on said substrate; and
   transforming said thin film of metal catalyst into said distribution of metal catalyst nanoparticles by an annealing process;
   growing carbon nanotube bundles on said distribution of metal catalyst nanoparticles; and
   depositing a continuous photoactive solar cell layer over said carbon nanotube bundles;
   further comprising, after said annealing, etching said nanoparticles to increase the average spacing between said nanoparticles.

2. A method as in claim 1, further comprising, after said growing, electrochemically depositing metal on said carbon nanotubes.

3. A method as in claim 1, further comprising, after said growing, catalytically depositing material on said carbon nanotubes from a gas phase precursor.

4. The method as in claim 1, wherein said growing comprises doping said carbon nanotubes with boron.

5. The method as in claim 1, further comprising ion implanting boron in said carbon nanotubes.

6. The method as in claim 1, wherein said depositing a continuous photoactive solar cell layer over said carbon nanotube bundles is hot wire chemical vapor deposition.

7. The method as in claim 1, wherein said substrate includes a conductive layer on the surface and said forming is forming a distribution of metal catalyst nanoparticles on said conductive layer.

8. The method as in claim 1, wherein said continuous photoactive solar cell layer comprises amorphous silicon.

9. The method as in claim 1, wherein said continuous photoactive solar cell layer comprises microcrystalline silicon.

10. The method as in claim 1, wherein said continuous photoactive solar cell layer comprises a material chosen from the group consisting of copper indium selenide, copper indium gallium selenide and cadmium telluride.

11. The method as in claim 1, wherein said carbon nanotube bundles are separated from each other by roughly one micron.

12. The method as in claim 1, wherein said carbon nanotube bundles are of the order of one micron tall and 0.1 micron in diameter.

13. The method as in claim 1, further comprising, after said growing and before said depositing said continuous photoactive solar cell layer, depositing an electrically conductive layer on the surface of said substrate, said electrically conductive layer electrically connecting said carbon nanotube bundles.

* * * * *

UNITED STATES PATENT AND TRADEMARK OFFICE
CERTIFICATE OF CORRECTION

PATENT NO. : 8,747,942 B2
APPLICATION NO. : 12/797529
DATED : June 10, 2014
INVENTOR(S) : Nalamasu et al.

It is certified that error appears in the above-identified patent and that said Letters Patent is hereby corrected as shown below:

In the Specification:

In Column 2, Line 13, delete "(CIGS)." and insert -- (CIGS), --, therefor.

In Column 8, Line 28, delete "250 mm to 1.1μn." and insert -- 250 nm to 1.1μm. --, therefor.

In Column 9, Line 27, delete "lift-off The" and insert -- lift-off. The --, therefor.

In the Claims:

In Column 11, Line 34, in Claim 2, delete "A method" and insert -- The method --, therefor.

In Column 12, Line 1, in Claim 3, delete "A method" and insert -- The method --, therefor.

Signed and Sealed this
Ninth Day of September, 2014

Michelle K. Lee
*Deputy Director of the United States Patent and Trademark Office*